(12) United States Patent
Kohno (10) Patent No.: US 7,292,316 B2
(45) Date of Patent: Nov. 6, 2007

(54) ILLUMINATION OPTICAL SYSTEM AND EXPOSURE APPARATUS HAVING THE SAME

(75) Inventor: Michio Kohno, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 33 days.

(21) Appl. No.: 10/984,826

(22) Filed: Nov. 9, 2004

(65) Prior Publication Data

US 2005/0099814 A1    May 12, 2005

(30) Foreign Application Priority Data

Nov. 12, 2003    (JP)    ............................. 2003-381928

(51) Int. Cl.
    G03B 27/54    (2006.01)
    G03B 27/42    (2006.01)
    F21V 1/00    (2006.01)
(52) U.S. Cl. ..................... 355/67; 355/53; 362/268
(58) Field of Classification Search ................. 355/53, 355/67, 71; 352/268; 362/268
    See application file for complete search history.

(56) References Cited

U.S. PATENT DOCUMENTS

| 5,237,367 A | * | 8/1993 | Kudo ........................... 355/67 |
| 5,245,384 A | * | 9/1993 | Mori ........................... 355/67 |
| 5,745,294 A | * | 4/1998 | Kudo ........................... 359/618 |
| 6,095,667 A | * | 8/2000 | Kamihara et al. ............ 362/311 |
| 6,100,961 A | * | 8/2000 | Shiraishi et al. ............... 355/67 |
| 6,392,740 B1 | * | 5/2002 | Shiraishi et al. ............... 355/53 |
| 2001/0026448 A1 | * | 10/2001 | Koizumi et al. ............ 362/268 |
| 2001/0033490 A1 | * | 10/2001 | Koyama et al. ............ 362/293 |
| 2002/0154284 A1 | * | 10/2002 | Sato ............................ 355/71 |
| 2002/0191170 A1 | * | 12/2002 | Komatsuda ................... 355/67 |
| 2003/0164933 A1 | * | 9/2003 | Nishi et al. .................... 355/67 |
| 2003/0197849 A1 | * | 10/2003 | Ishikawa et al. ............... 355/69 |

FOREIGN PATENT DOCUMENTS

| JP | 62-115718 | 5/1987 |
| JP | 62-115719 | 5/1987 |
| JP | 01-286478 | 11/1989 |
| JP | 07-306304 | 11/1995 |
| JP | 2002-222757 | 8/2002 |
| JP | 2003-232901 | 8/2003 |

OTHER PUBLICATIONS

English language Patent Abstract for JP 2003-232901.
DIALOG English language Abstract for 01-286478.
DIALOG English language Abstract for 2002-222757.
DIALOG English language Abstract for 2003-232901.

* cited by examiner

Primary Examiner—Alan Mathews
(74) Attorney, Agent, or Firm—Morgan & Finnegan, LLP (57) ABSTRACT

An illumination optical system for Koehler-illuminating a target surface with light from a light source includes a light integrator for forming a secondary light source, the light integrator including plural elements formed directly onto a substrate; a condenser for condensing the light from the light integrator; and a shield for shielding the light that goes straight in interfaces among the plural elements from an effective illumination area on the illuminated surface.

4 Claims, 9 Drawing Sheets

ILLUMINATION OPTICAL SYSTEM AND EXPOSURE APPARATUS HAVING THE SAME

BACKGROUND OF THE INVENTION

The present invention relates generally to an exposure apparatus, and more particularly to an illumination optical system for uniformly illuminating a reticle (or a mask) which has a pattern, in an exposure apparatus used in a photolithography process for fabricating semiconductor devices, liquid crystal display devices, image pick-up devices (CCD, and the like), thin-film magnetic heads, and the like.

Recently, a manufacture of finer semiconductor devices has increased demands for high throughput with a design rule for a mass production line of 130 nm. The fine processing with improved resolution requires the uniform light intensity for illuminating a reticle or a mask and the uniform effective light-source distribution as an angular distribution of the exposure light for illuminating the reticle (or mask) as well as a shortened wavelength of exposure light and a higher numerical aperture ("NA") of a projection lens.

Shortening the wavelength of exposure light can cause an increased absorption in an optical material, such as a glass material and optical coating, lowering the transmittance disadvantageously. Therefore, instead of a conventional dioptric projection optical system that includes only lenses, use of catoptric (i.e., full mirror type) and catadioptric (i.e., lens and mirror hybrid type) projection optical systems have been conventionally proposed. See, for example, Japanese Patent Applications Publication Nos. 62-115718 and 62-115719.

A projection optical system that uses a mirror usually shields the light near the optical axis, and the aberrational correction addresses only the off-axis image points. As a result, the exposure apparatus transfers a pattern by illuminating an off-axis imaging area. This imaging area is often rotationally symmetrical around the optical axis, and typically has an arc shape with a certain width. The arc shape imaging area can achieve high-throughput if applied to an optical lithography that exposes a large-scale liquid crystal substrate with the mirror optical system.

To uniformly illuminate a mask and to make an effective light-source distribution uniform, a conventional method proposes to combine an illumination optical system with a collimator lens and a fly-eye lens that includes plural fine lenses or lens elements. The fly-eye lens forms a secondary light source corresponding to the number of lens elements near the exit surface, and uniformly illuminate an illuminated surface through superimpositions of beams from plural directions.

Increasing the number of lens element of the fly-eye lens is effective to form a more uniformly illumination area. However, the lens elements are an independent lens respectively, so the cost increases by gaining the numbers of the lens elements. Moreover, it is not easy working to make the fly-eye lens that arranged the lens elements by the common difference of corresponding.

A method of making a diffraction element and a microlens element on one glass substrate by a means such as etching and mechanical polishing is researched. See, for example, Japanese Patent Application Publication No. 7-306304. A one that micro element lens with the lens function is directly formed to one glass substrate by using photolithography is called a micro-lens array. The unitary-type (micro) fly-eye lens formed to substrate as one body makes minute 1 mm or less an individual lens element. As a result, the number of irradiation points as an optical integrator increases, and more uniformly effective light-source can be provided to the projection optical system. In addition, a manufacture becomes easy, and low-cost can be achieved.

However, the unitary-type fly-eye lens has a problem in that the uniform illumination distribution cannot necessarily be formed. Thereby, the unitary-type fly-eye lens generates a step with little lens function at interface to form plural lens elements on one substrate three-dimensionally and periodically. This step does not contribute to uniform mask illumination, and the light that passes through the step goes straight.

This light then condenses in a mask plane or an intermediate imaging plane conjugate with it by a function of a subsequent condenser lens. This is because the Koehler illumination substitutes an angular relationship at an incident side of the condenser lens for a positional relationship on an illuminated surface, and the light that goes straight without receiving the lens function in the step of the unitary-type fly-eye lens condenses at one point of the illuminated surface regardless of incident positions upon the condenser lens. The condensing point forms an abnormal point, which is called a hot spot, causes non-uniform light intensity. In other words, the hot spot makes the light intensity distribution non-uniform on the illuminated surface. This results in an abnormal integral exposure dose in the exposure plane and an abnormal critical dimension in the circuit pattern, decreasing the yield.

The unitary-type reflection optical integrator that directly forms fine reflective elements on the substrate has a similar problem.

Accordingly, it is demanded to provide an illumination optical system and an exposure apparatus that can uniformly illuminate an illuminated surface even when using the unitary-type optical integrator.

BRIEF SUMMARY OF THE INVENTION

An illumination optical system according to one aspect of the present invention for Koehler-illuminating a target surface with light from a light source includes a light integrator for forming a secondary light source, the light integrator including plural elements formed directly onto a substrate; a condenser for condensing the light from the light integrator; and a shield for shielding the light that goes straight in interfaces among the plural elements from an effective illumination area on the illuminated surface.

An exposure apparatus according to another aspect of the present invention includes the above illumination optical system, and a projection optical system for projecting a pattern of the reticle onto an object to be exposed.

A device fabrication method according to another aspect of the present invention includes the steps of exposing an object using the above exposure apparatus, and developing the object exposed.

Other objects and further features of the present invention will become readily apparent from the following description of the preferred embodiments with reference to the accompanying drawings.

DETAILED DESCRIPTION OF THE PREFERRED EMBODIMENTS

Figure 15:
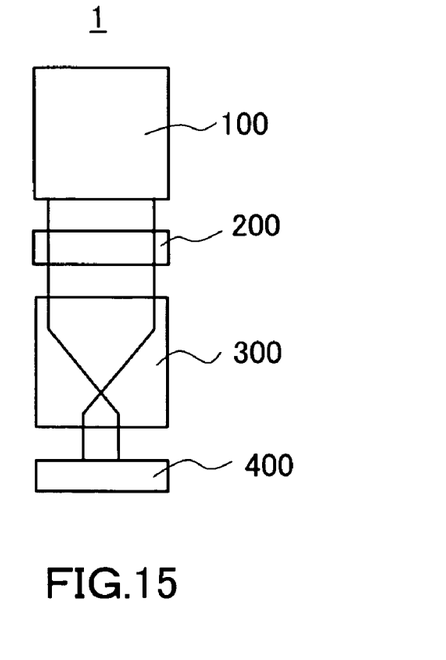
FIG. 15 shows a simplified optical path of an exposure apparatus of the present invention.

With reference to the accompanying drawings, a description will be given of an exposure apparatus 1 of the instant embodiment. A detailed description will now be given of the exposure apparatus 1, with reference to FIG. 15. Here, FIG. 15 is a schematic view of a simplified optical path of the exposure apparatus 1. The exposure apparatus includes an illumination apparatus 100, a mask 200, a projection optical system 300, and a plate 400.

The exposure apparatus 1 of this embodiment is a projection exposure apparatus that exposes a circuit pattern created on the mask 200 in a step-and-scan manner onto the plate 400, but the present invention can apply a step-and-repeat manner and other modes of exposure method. The "step-and-scan" manner, as used herein, is one mode of exposure method that exposes a mask pattern onto the plate by continuously scanning the plate relative to the mask and by moving, after a shot of exposure, the plate stepwise to the next exposure area to be shot. The "step-and-repeat" manner is another mode of exposure method that moves the plate stepwise to an exposure area for the next shot every shot of cell projection onto the plate.

Figure 1:
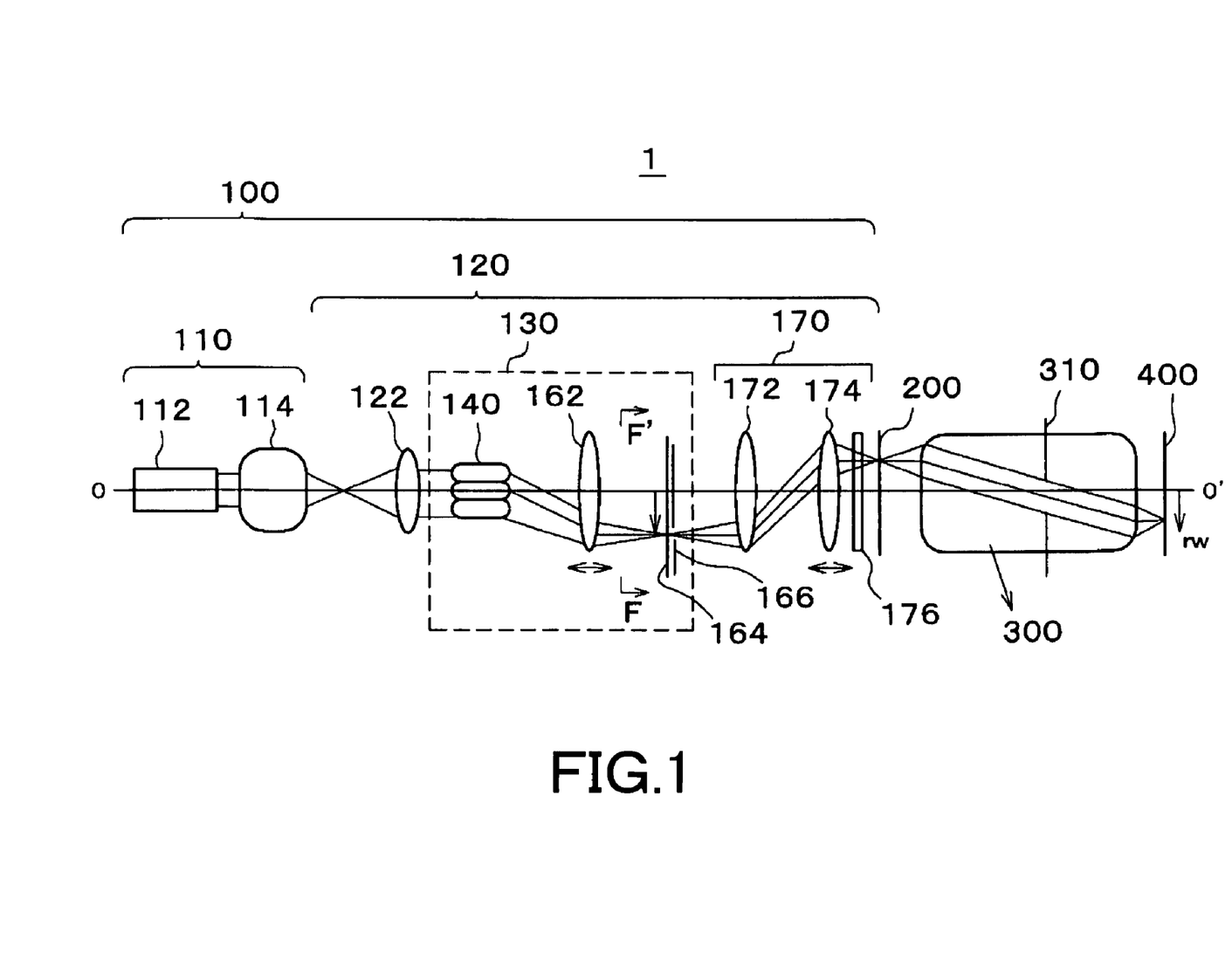
FIG. 1 shows a simplified optical path of an exposure apparatus of a first embodiment according to the present invention.

The illumination apparatus 100 illuminates the mask 200 that has a circuit pattern to be transferred with a uniform light intensity distribution and a uniform effective light source, and includes a light source part and an illumination optical system. FIG. 1 is an embodiment of the exposure apparatus 1 shown in FIG. 15. The illumination apparatus 100 includes a light source part 110 and an illumination optical system 120. The light source part 110 includes a light source 112 and a beam shaping optical system 114.

The light source 112 employs laser beams such as an ArF excimer laser with a wavelength of 193 nm, a KrF excimer laser with a wavelength of 248, an $F_2$ laser with a wavelength of 157 nm, etc. in this embodiment. However, the laser type is not limited to excimer lasers because for example, a YAG laser may be used. Similarly, the number of laser units is not limited. For example, two independently acting solid lasers would cause no coherence between these solid lasers and significantly reduces speckles resulting from the coherence. An optical system for reducing speckles may swing linearly or rotationally. A light source applicable for the light source part 110 is not limited to a laser, and may use one or more lamps such as a mercury lamp and a xenon lamp.

The light source part 110 may use a soft X-rays and an EUV light source with a wavelength of 13 to 14 nm. Since no optical element transmits this wavelength and the optical system should include only mirrors. Such an optical system can use any structure known in the art, and a detailed description of its structure and operation will be omitted.

The beam shaping system 114 may use, for example, a beam expander, etc., with a plurality of cylindrical lenses, and convert an aspect ratio of the size of the sectional shape of parallel beams from the laser light source into a desired value (for example, by changing the sectional shape from a rectangle to a square), thus reshaping the beam shape to a desired one. The beam shaping system 114 forms a beam that has a size and divergent angle necessary for illuminating an optical integrator 140 described later.

Preferably, the light source part uses an incoherently turning optical system, though it is not shown in FIG. 1, which turns a coherent laser beam into an incoherent one. The incoherently turning optical system may use, for example, at least one return system that splits an incident beam into at least two beams (e.g., p polarized light and s polarized light) at a light splitting plane, provides one of them, relative to the other beam, with an optical path length difference more than the coherence length of a laser beam via an optical member, and then leads it to the light splitting plane again so that the superimposed light is emitted.

The illumination optical system 120 includes a first condenser lens 122, a decentering illumination area forming part 130, and a masking imaging system 170. The first condenser lens 122 arranges an exit surface of the beam shaping system 114 and an incident surface in a fly-eye lens 140, which will be described later, in the decentering illumination area forming part 130 in a Fourier transformation relationship. In the instant application, the Fourier transformation relationship means an optical relationship between a pupil plane and an object plane (or image plane) or an object plane (or an image plane) and a pupil plane. If necessary, the beam shaping system 114 may include deflecting mirrors between the beam shaping system 114 and the first condenser lens 122.

The fly-eye lens 140, which will be described later, is located at a rear focal point of the first condenser lens 122, forming a telecentric optical system on its exit side. When the telecentric optical system is formed on the exit side, the principal ray of light that has passed through the lens 122 becomes parallel to any of central and peripheral lens elements 142 in the fly-eye lens 140.

When the telecentric optical system is not formed on the exit side of the first condenser lens 122 and the center lens element 142 in the fly-eye lens 140 has approximately the same NA (i.e., not-shielding NA) as that of the incident light, the peripheral lens element 142 identical to the central lens element 142 shield the incident light because the principal ray inclines. In order to prevent the light incident upon the fly-eye lens 140 from being shielded by each lens elements 142, the peripheral lens elements 142 should have higher NA than the central lens elements by an inclination of the incident principal ray.

However, as described later with reference to FIGS. 6 to 9, diameters of respective lens elements 142 of the fly-eye lens 140 cannot be optimized. Therefore, the central lens element 142 and the peripheral lens element 142 should be identical for the closest packing arrangement. The telecentric optical system at the exit side of the first condenser lens 122 would enable all the lens elements 142 in the fly-eye lens 140 to share the not-shielding minimum NA of the central lens elements 142.

Figure 3:
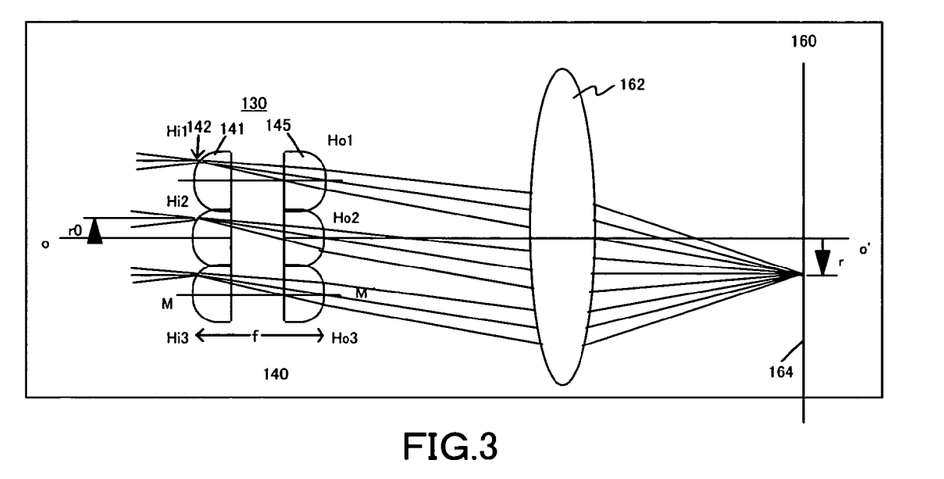
FIG. 3 shows an optical path for explaining operations of decentering illumination area forming means shown in FIG. 1.

The decentering illumination area forming part 130 serves to form the off-axis illumination light that offsets from the optical axis OO', and includes the fly-eye lens 140, a second condenser lens 162, a first illuminated surface 164, and a slit 166. FIG. 3 shows a typical optical path when the decentering illumination area forming part 130 shown in FIG. 1 forms the off-axis illumination light.

Figure 4:
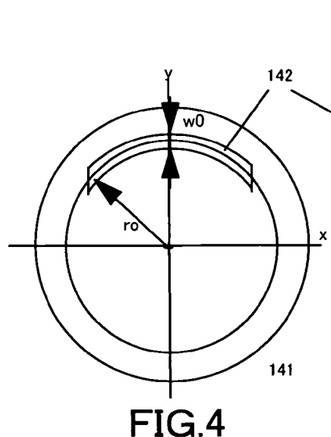
FIG. 4 is a plane view for explaining the way of cutting out a lens element at an incident side of a fly-eye lens shown in FIG. 1, from a spherical lens.

The fly-eye lens 140 is one type of a light integrator for converting an angular distribution of the incident light into a positional distribution and then emits the light. The fly-eye lens 140 has, as shown in FIG. 4, a shape that cuts out an arc with a predetermined width, i.e., light transmission part in FIG. 3, concretely, an area of arc width wo that distances only of radius ro from optical axis of the spherical lens, from a semicircle, and layers plural (fourteen in the instant embodiment) arcs to become almost similarity shape of the illumination area on the wafer surface. The fly-eye lens 140 of the instant embodiment is the unitary-type micro fly-eye lens, and is actually not cut out and layers because the lens element is formed to one glass substrate with the means such as etching and mechanical polishing as one body. However, the shape of each lens element can be easily understood according to the cut out shape, so it is shown that each lens elements cuts out and layer in FIGS. 4 to 9.

Figure 5:
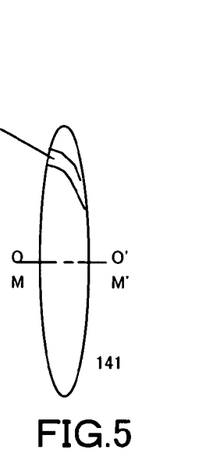
FIG. 5 is a side view for explaining the way of cutting out a lens element at an incident side of a fly-eye lens shown in FIG. 1, from a spherical lens.
Figure 6:
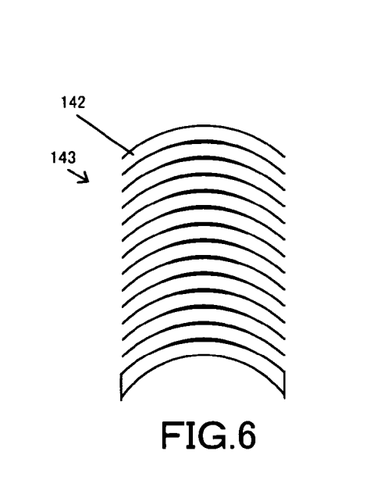
FIG. 6 is a plane view of a layered structure at the incident side of the lens elements of the fly-eye lens shown in FIG. 1.
Figures 7, 8:
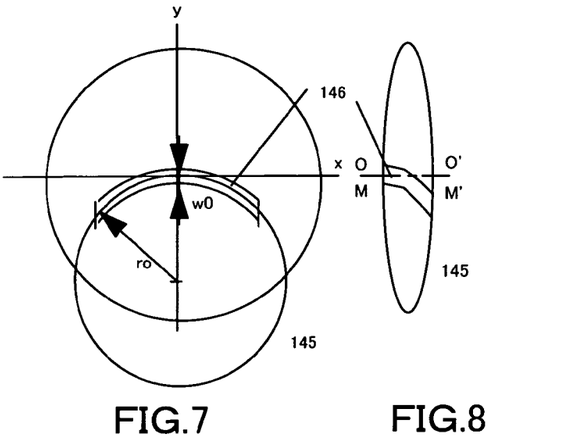
FIG. 7 is a plane view for explaining the way of cutting out a lens element at an exit side of a fly-eye lens shown in FIG. 1, from a spherical lens.
FIG. 8 is a side view for explaining the way of cutting out a lens element at an incident side of a fly-eye lens shown in FIG. 1, from a spherical lens.
Figure 9:
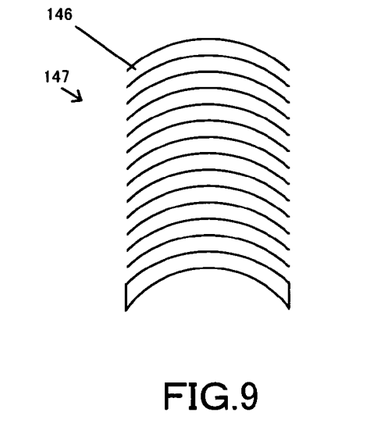
FIG. 9 is a plane view of a layered structure at exit side of the lens elements of the fly-eye lens shown in FIG. 1.

A description will now be given of an arc-shaped structure of fly-eye lens. FIG. 4 is a plan view for explaining the shape of incident lens element 142 as an effective area from an incident lens 141. FIG. 5 is a side view of the incident lens 141 shown in FIG. 4. FIG. 6 is a plane view of the incident lenses 143 formed by layering fourteen incident lens elements 142. FIG. 7 is a plane view for explaining the way of cutting out the exit lens element 146 as an effective area from an exit lens 145. FIG. 8 is a side view of the exit lens 145 shown in FIG. 7. FIG. 9 is a plane view of the incident lenses 147 formed by layering exit lens elements 146.

The fly-eye lens 140 includes the incident lens element 142 and the exit lens element 146 spaced by a focal distance f. Since a pair of the incident and exit lens elements 142 and 146 are spaced by a focal distance f, the incident and exit surfaces have a Fourier transformation relationship. The incident and exit lens elements 142 and 146 are similar to the imaging area on the projection optical system 300 or the illuminated area on the plate 400. This is due to the following reasons: The condenser lens 162 arranges the incident surface of the incident lens 142 and the first illuminated surface 164 in an optically conjugate relationship, as clarified from FIG. 3. The first illuminated surface 164 is conjugate, as shown in FIG. 1, with the mask surface due to the masking imaging system 170. Finally, the projection optical system 300 makes these conjugate surfaces conjugate with the plate 400 surface. When the sectional shapes of the incident and exit lens elements 142 and 146 are made similar to a shape of the illuminated area on the plate 400, the arc illumination area is directly formed on the plate 400 surface in appearance. This is a requirement for effective arc illuminations.

Referring to FIGS. 4 to 7, the incident lens element 142 has a similar figure to an annular exposure area ARC on a surface of the plate 400, which will be described with reference to FIG. 2. The incident lens 141 shown in FIG. 5 and the exit lens 145 shown in FIG. 8 have the same spherical lens, but the incident and exit lens elements 142 and 146 are different in that they are cut at different positions from the incident and exit lenses 141 and 145. This is because the light that passes through the incident lens element 142 is deflected to the axis, as shown in FIG. 3. As a result, the illumination light passes through the fly-eye lens 140 without being shielded, and forms the arc illumination area at the position distant by a radius r on the mask 200 surface. The radius r and arc width of the illumination area have values of the radius ro and arc width wo of the fly-eye lens 140 multiplied by a ratio of a focal length of the condenser lens 162 and a focal length of the fly-eye lens 140. Here, FIG. 3 is a detailed view of the decentering illumination area forming means 130 shown in FIG. 1. The fly-eye lens 140 shown in FIG. 3 is shown briefly, and the actual fly-eye lens 140 corresponds to FIGS. 4 to 9. The fly-eye lens 140 includes incident lens group 143 (are Hi1, Hi2, and Hi3 in FIG. 3 on the light source side) that includes plural exemplary lens elements 142, and exit lens group 147 (are Ho1, Ho2, and Ho3 in FIG. 3 on the image plane) that includes plural exemplary lens elements 146, and both lens groups 143 and 147 are spaced by the focal distance f.

Figure 10:
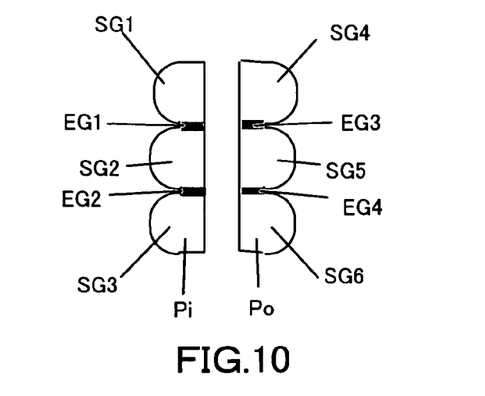
FIG. 10 is a sectional view of the fly-eye lens shown in FIG. 1.

FIG. 10 is a sectional view of the fly-eye lens 140. SG1, SG2, and SG3 on the incident side of light are produced on a plate Pi by etching and mechanical polishing as one body among individual lens elements of FIG. 10, and have the same optical shape as shown in FIGS. 4 and 5, forming the integrated pattern shown in FIG. 6 on the plate Pi. Similarly, SG4, SG5, and SG6 on the exit side of light are produced on a plate Po as one body among individual lens elements of FIG. 10, and have the same optical shape as shown in FIGS. 7 and 8, forming the integrated pattern shown in FIG. 9 on the plate Po.

The unitary-type fly-eye lens 140 has micro-lens elements with a size of 1 mm or less. However, steps (or areas of EG1 to EG4 shown in FIG. 10 are generated in an interface so as to form plural lens elements on one substrate three-dimensionally and periodically, and the step does not have a function of uniformization. The light that has passed through the step diffuses evenly and becomes flare is less influential. On the other hand, an abnormal point of non-uniform light intensity called a hot spot is formed when the light that has passed through the step condenses on the target surface by the function of the subsequent condenser as shown in a broken line in FIG. 11. This causes an abnormal integral exposure dose on the exposure plane, and brings an abnormal critical dimension of the circuit pattern, resulting in a defective chip. The instant embodiment solves the above-mentioned problem by arranging the light that goes straight into the step, outside the effective illumination area, and allowing a shield part of the slit 166 to shield the light.

If necessary, a stop (not shown) is provided near the exit surface of the fly-eye lens 140. The stop is a variable aperture stop that shields unnecessary light to form a desired shape of a secondary light source, and various stops are available such as a circular aperture stop and a stop for annular illumination. A modified illumination is available with an aperture stops that has an annular or quadrupole opening. The modified illumination method or oblique incidence illumination method that uses such an aperture stop can extend the limits of the resolving power. The replacement of the variable aperture stop may use, for example, a disc turret that forms these aperture stops, and a controller and a drive mechanism (not shown) turns the turret to switch the opening. Such an aperture stop can vary an illumination mode.

Figure 11:
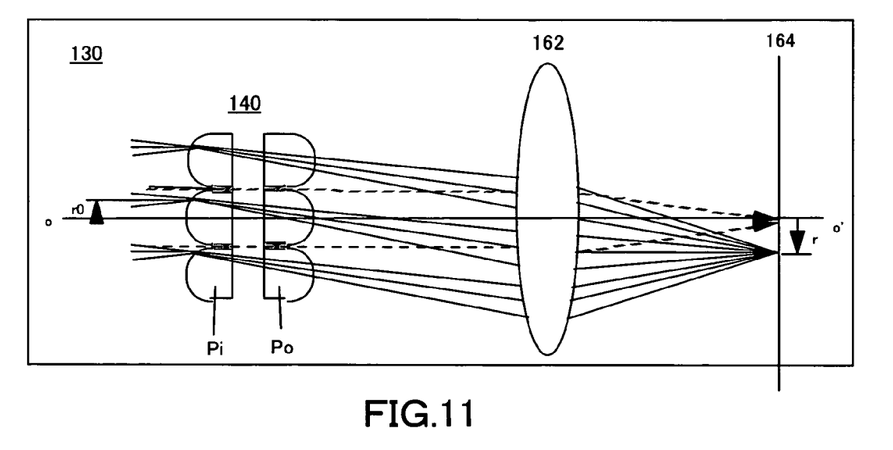
FIG. 11 shows an optical path where a hot spot occurs on-axis in the fly-eye lens shown in FIG. 1.
Figure 12:
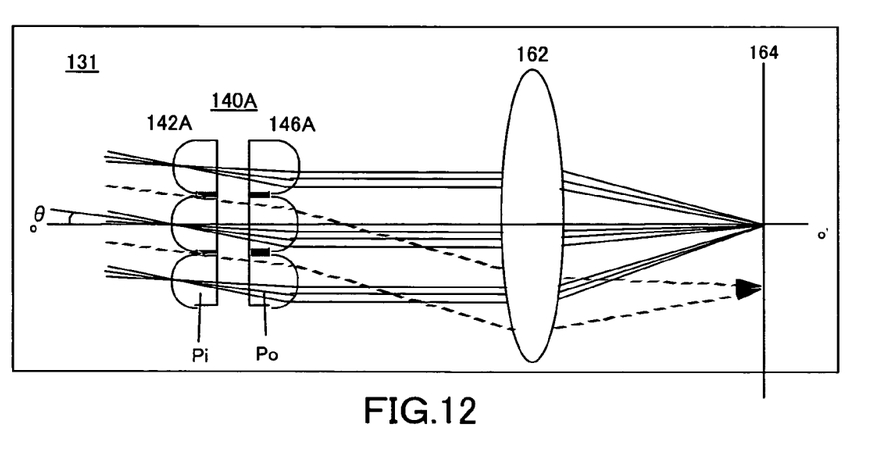
FIG. 12 shows an optical path where a hot spot off-axis occurs in the fly-eye lens shown in FIG. 1.

The slit 166 has an arc light transmitting part and a light shielding part on a uniformly illuminated area by the second condenser lens 162. The light that has passes through the light transmitting part in the slit 166 is used as illumination light for the mask 200. The slit 166 is provided on a focal plane of the second condenser lens 162, and maintains the telecentric optical system. The shading part of the slit 166 shades the light that goes straight in the step as the above-mentioned. If necessary, a cooling mechanism that prevents heat deformation of the slit 166 is provided. The lens 162 can be movable along the optical axis OO'. If it is possible to shade the light, neither the shape nor the structure are asked. For example, the shape and structure shown in FIGS. 11 and 12 are acceptable.

The masking imaging optical system 170 serves to re-image an aperture image of the slit 166 on the mask 200, and includes a first lens system 172, and a second lens system 174. The lens systems 172 and 174 include plural lenses. If necessary, deflecting mirrors may be inserted between the lens systems 172 and 174. The instant embodiment makes the second lens system 174 movable along the optical axis OO', and drivable by a driver (not shown).

The lens 162 and 174 has a zoom function like this, and the zoom function is preferably provided to change a size of the effective light source while maintaining the size of the secondary light source. Thereby, a shape of the effective light source can be changed while the shielding by the integrator is prevented. This mechanism is preferable particularly when the illumination mode is varied. A control system that drives the lens 162 and 174 includes, for example, a controller, a detector, and a driver. The controller detects, through the detector, an offset of the telecentricity of the light incident upon the projection optical system 300 i.e., an offset angle between the principal ray and the optical axis OO', and controls the driver to remove the offset by moving the second condenser lens 162 and/or the second lens system 174 along the optical axis OO'.

The mask 200 forms a circuit pattern (or an image) to be transferred. Diffracted light emitted from the mask 200 passes through the projection optical system 300, and then is projected onto the plate 400. The plate 400 is an object to be exposed, onto which resist is applied. The slit 166 and the mask 200 are arranged in a conjugate relationship. A light exit surface of the fly-eye lens 140 and the mask 200 have a Fourier transformation relationship. The mask 200 and the plate 400 have a conjugate relationship.

In case of a scanning exposure apparatus, a pattern on the mask 200 is transferred onto the plate 400 by scanning the mask 200 and the plate 400. In case of a stepper (a step-and-repeat exposure apparatus), the mask 200 and the plate 400 synchronously moves still when exposing the mask pattern. A relative position of both is fixes or remains still when exposing the mask pattern.

The projection optical system 300 images the light from the pattern formed on the mask 200 onto, and uses a catadioptric optical system that includes plural lens elements and at least one concave mirror. However, the projection optical system 300 applicable to the present invention covers a catoptric optical system, a special lens type, and so on. Any necessary correction of the chromatic aberration may use a plurality of lens units made from glass materials having different dispersion values (Abbe values), or arrange a diffractive optical element such that it disperses in a direction opposite to that of the lens unit. The projection optical system has the stop 310, and telecentrically images the off-axis light that represents the circuit pattern on the mask 200 onto the plate 400. The optical axis OO' in the projection optical system 300 accords with the optical axis OO' in the illumination optical system 120. In other words, the illumination optical system 120 and the projection optical system 300 are arranged in a co-axial relationship.

Figure 2:
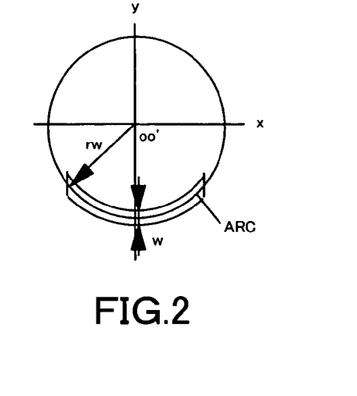
FIG. 2 is a view of arc imaging area by a projection optical system shown in FIG. 1.

The illumination optical system 120 forms an illuminated area on the first illuminated surface 164, and the illuminated area has an approximately similar figure to the off-axis effective imaging area ARC and the optical axis OO' shown in FIG. 2. Then, the light illuminates the mask 200 after passing through the slit 166 and the masking imaging system 170. The second condenser lens 162 uses uniformly illuminates the mask through Koehler illumination.

Figure 13:
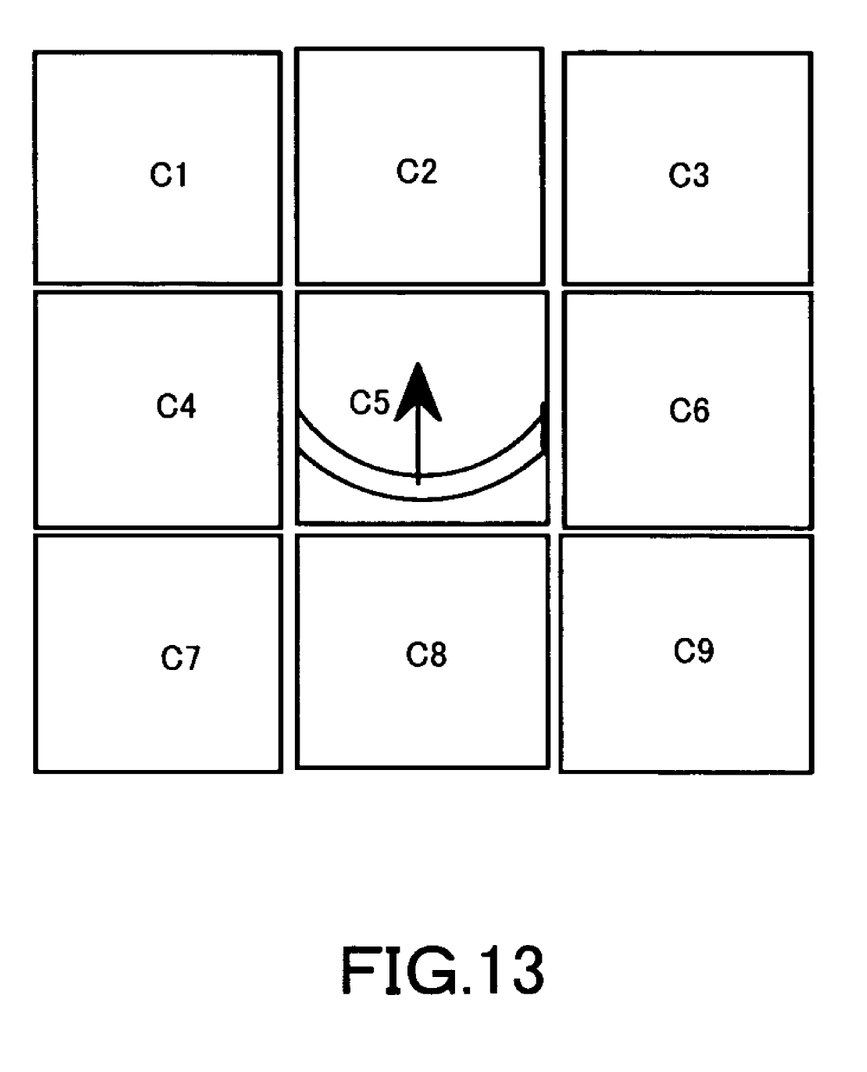
FIG. 13 is a conceptual view of scanning exposure on a wafer shown in FIG. 1.

The light that has passed through the mask 200 is projected onto the plate 400 at a predetermined reduction ratio by the projection optical system 300. The projection optical system 300 forms the arc pattern transfer area ARC on the plate 400 as shown in FIG. 2, and scans the plate 400 in the arc width direction by the synchronous scanning of the mask 200 and the plate 400, exposing the entire shot (C5 in FIG. 13). Then, a stage for the plate 400 is stepped to the next shot, and many shots (C1 to C9) are exposed and transferred on the plate 400.

The plate 400 is a wafer in this embodiment, but it may include a liquid crystal plate and a wide range of other objects to be exposed. Photoresist is applied onto the plate 400. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photo resist and a base (i.e., a process to increase the hydrophobicity by applying a surface active agent), through a coat or vaporous process using an organic film such as HMDS (Hexamethyldisilazane) The pre-bake treatment is a baking (or burning) step, softer than that after development, which removes the solvent.

The plate 400 is supported by a wafer stage (not shown) The wafer stage may use any structure known in the art, and thus a detailed description thereof will be omitted. For example, the wafer stage uses a linear motor to move the plate 400 in a direction orthogonal to the optical axis. The mask 200 and the plate 400 are, for example, scanned synchronously, and the positions of the mask stage and wafer stage are monitored, for example, by a laser interferometer and the like, so that both are driven at a constant speed ratio. The wafer stage is installed on a stage stool supported on the floor and the like, for example, via a damper.

A description will now be given of the operation of the exposure apparatus 1. In exposure, light emitted from the light source 112 is reshaped into a desired beam shape by the beam shaping optical system 114, and then enters the fly-eye lens 140 via the lens 122. The fly-eye lens 140 uniformly illuminates the illuminated surface 164 via the condenser lens 162. In this case, the hot spot on the optical axis as shown in FIG. 11 is formed on the optical axis of the illuminated surface 164, but the point does not influence the illumination area because shifts from the illumination effective area (arc area of off-axis), and shades completely by the shading part of the slit 166 or the above-mentioned embodiment. When the illumination mode changes, the size of the effective light-source can be adjusted by driving lens 162 etc.

The light that has passed the mask 200 is projected onto the plate 400 under a predetermined reduction magnification by the imaging operations of the projection optical system 300. The angular distribution of the exposure light on the plate 400 (i.e., the effective light source distribution) becomes approximately uniform. If the exposure apparatus 1 is a stepper, it will fix the light source part and the projection optical system 300, and synchronously scan the mask 200 and the plate 400, then exposing the entire shot. The wafer stage of the plate 400 is stepped to the next shot, thus exposing and transferring a large number of shots on the plate 400. If the exposure apparatus 1 is a scanner, exposure would be performed with the mask 200 and the plate 400 in a stationary state. The instant embodiment can Koehler-illuminate the mask 200 more uniformly and prevent the bad influence of the step because the lens element of the fly-eye lens 140 is refined, and can manufacture devices, such as semiconductor chips, such as LSIs and VLSIs, CCDs, LCDs, magnetic sensors, and thin-film magnetic heads, with high throughput.

Figure 14:
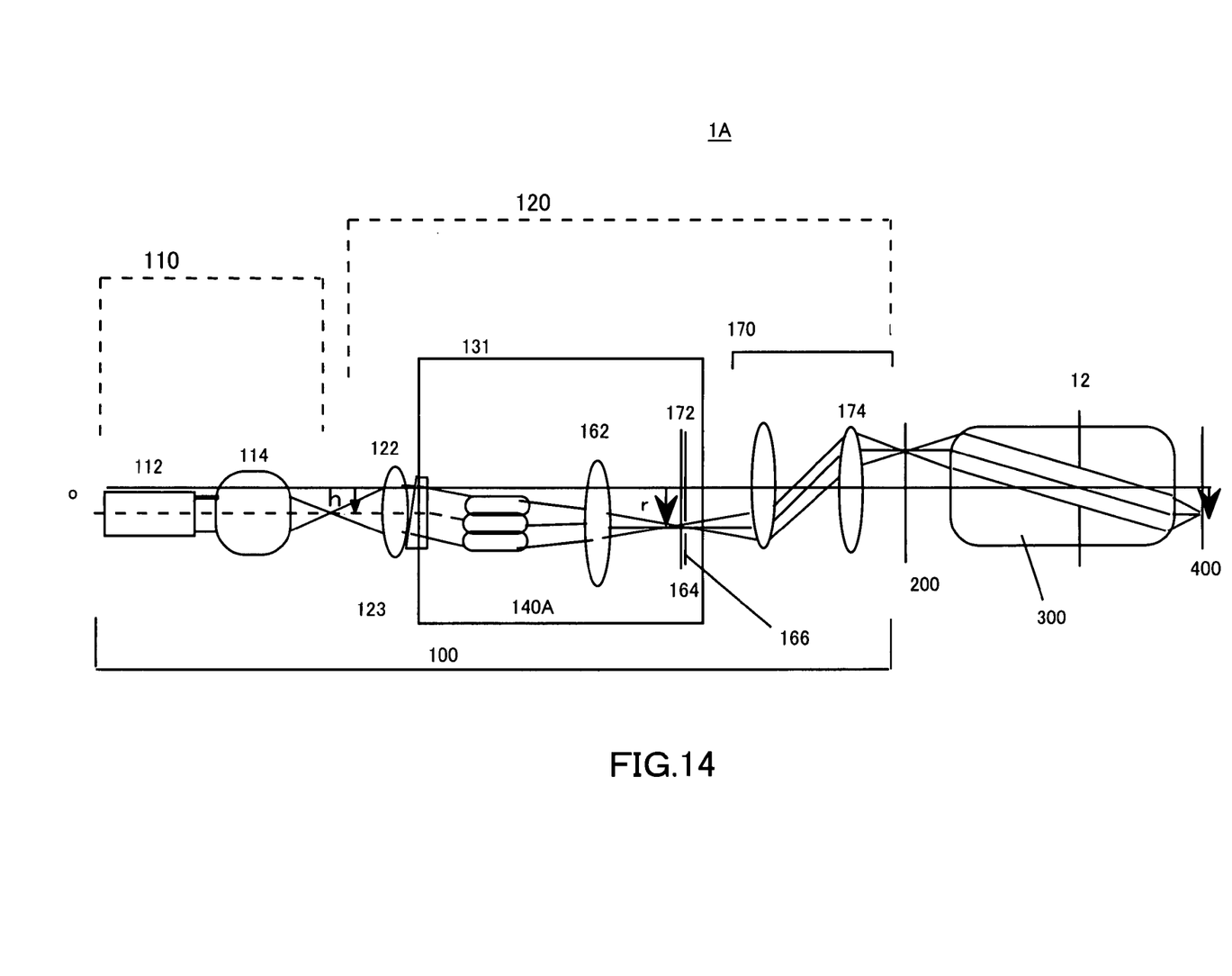
FIG. 14 shows a simplified optical path of an exposure apparatus of a second embodiment according to the present invention.

A description will now be given of an exposure apparatus 1A as a variation of the exposure apparatus shown in FIG. 1. Here, FIG. 14 shows a simplified optical path of the exposure apparatus 1A. The exposure apparatus 1A is different from the exposure apparatus 1 in that the optical axis from the light source part 110 to the second condenser lens 162 is decentered from the optical axis of the projection optical system 300. More in detail, the optical axis from the light source part 110 to the first condenser lens 122 is decentered by h from the optical axis of the projection optical system 300, and a fly-eye lens 140A and the second condenser lens 162 is decentered by r. The angle deflection member (a chock glass) 123 is located at the exit side of the first condenser lens, and gives an angle to the incident light in the fly-eye lens 140A. The following relationship exists between the angle deflection volume .theta. and the fly-eye lens 140A.

FIG. 12 shows an imaging relationship of an illumination area forming part 131 shown in FIG. 14. Similar to FIG. 11, the unitary-type fly-eye lens 140A and the second condenser lens 162 Koehler-illuminate the first illuminated surface 164. A different point is to be composed without the component that the incident light in the fly-eye lens 140A is parallel to the optical axis by the function of the angle deflection member 123 (not shown in FIG. 12) arranged on the light source side. A fly-eye lens group 142A of the incident side and a fly-eye lens group 146A of the exit side are arranged contrary to the case of FIG. 11. In other words, the lens element 142A on the plate Pi shown in FIG. 12 is formed by cutting out include the optical axis of the spherical lens shown in FIG. 7, and the lens element 146A on the plate Po of the exit side shown in FIG. 4 is formed by cutting out off-axis of the spherical lens shown in FIG. 4. Therefore, the effective illumination area includes the optical axis on the illuminated surface 164, oppositely, a stray light that goes straight in the step of the fly-eye lens 140A forms the hot spot outside the effective illumination area and off-axis. The feature of the instant embodiment can arrange the fly-eye lens 140A on the optical axis of the second condenser lens 162, the aperture of the second condenser lens 162 can be reduce, and the entire optical system can be made compact.

The above description mainly addresses operations of the present invention about the arc illuminated area. However, the present invention is not limited to the arc illumination, and is applicable to the projection optical system that has an on-axis or off-axis rectangular imaging area, as described later. In this case, in order for a final fly-eye lens to from the rectangular illuminated area, a sectional shape of each lens element should be shaped to a similar figure to the illuminated area on the final image plane.

Figure 16:
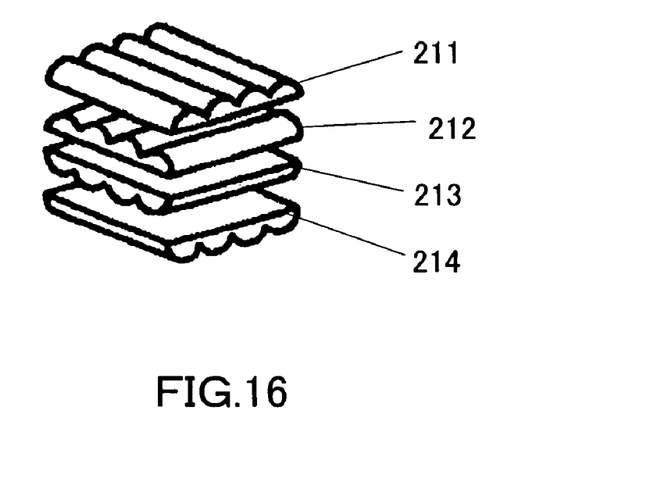
FIG. 16 is a perspective view of an arrangement of a cylindrical fly-eye lens.

The wave front splitting type optical integrator applicable to this invention is not limited to a fly-eye lens but may be, for example, as shown in FIG. 16, multiple sets of cylindrical lens array plates in which respective sets are arranged orthogonal to each other. A fly-eye lens having a rod lens with three or more refracting interfaces may also be used. The light integrator may be a mirror type integrator that has been coated. The mirror type integrator is especially suitable for the EUV light source.

Cylindrical lens array plates shown in FIG. 16 form a lens by layering a pair of convex cylindrical lenses having the same generating line or bus and another pair of convex cylindrical lenses having the same generating line that is orthogonal to the previous one. Thus, the plates are formed by stacking two sets of cylindrical lens array plates or lenticular lenses. The cylindrical lens array plates of the first set 211 and the fourth set 214 in FIG. 16 each have a focal length f1, and the cylindrical lens array plates of the second set 212 and the third set 213 have a focal length f2 different from f1. A cylindrical lens array plate in the same set is arranged at the focal position of its counterpart. Two sets of cylindrical lens array plates are arranged such that mutual bus directions are orthogonal to each other, and create beams that differ in F-number in the orthogonal direction (or lens focal length/effective aperture). Of course, the number of sets is not limited to two. So long as multiple cylindrical lenses that have orthogonal mutual bus directions, the number of cylindrical lenses is not limited.

Figure 17:
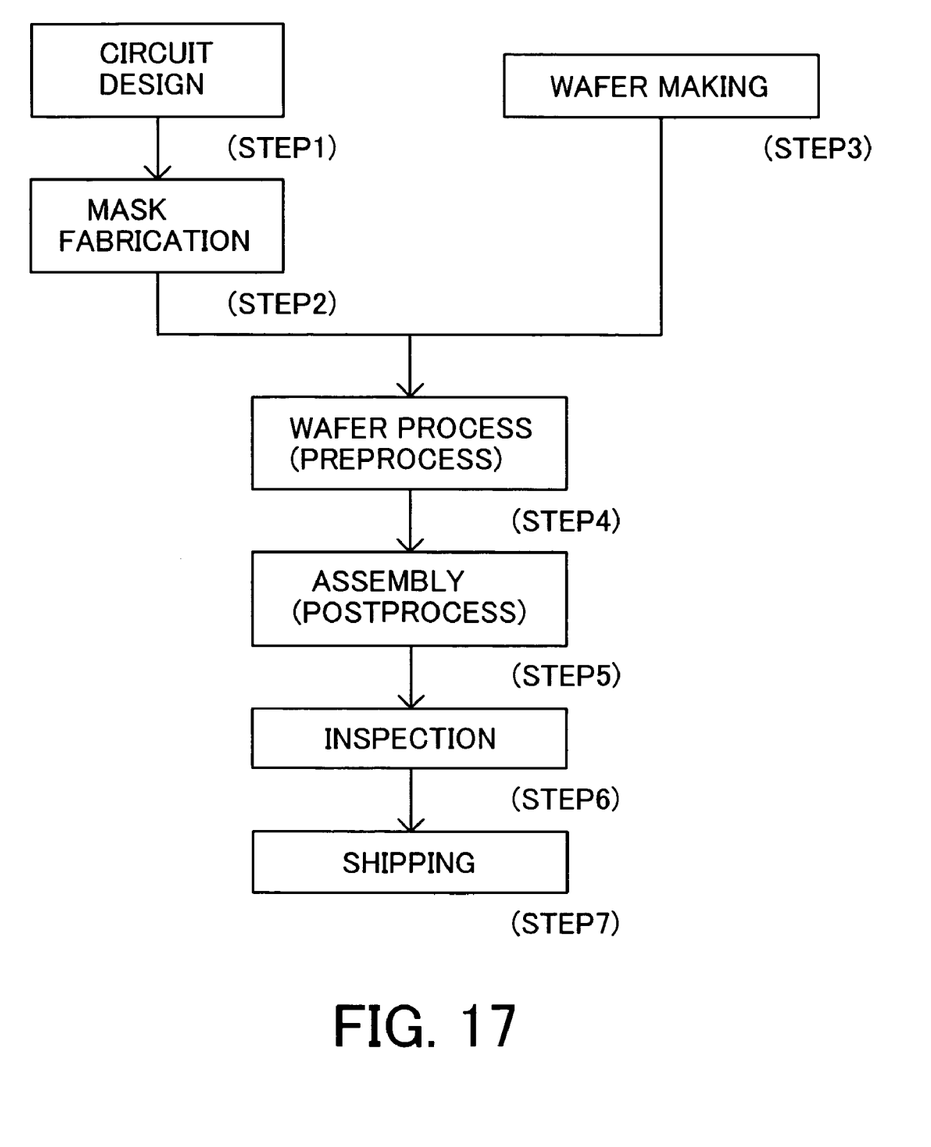
FIG. 17 is a flowchart for explaining a method for fabricating devices.
Figure 18:
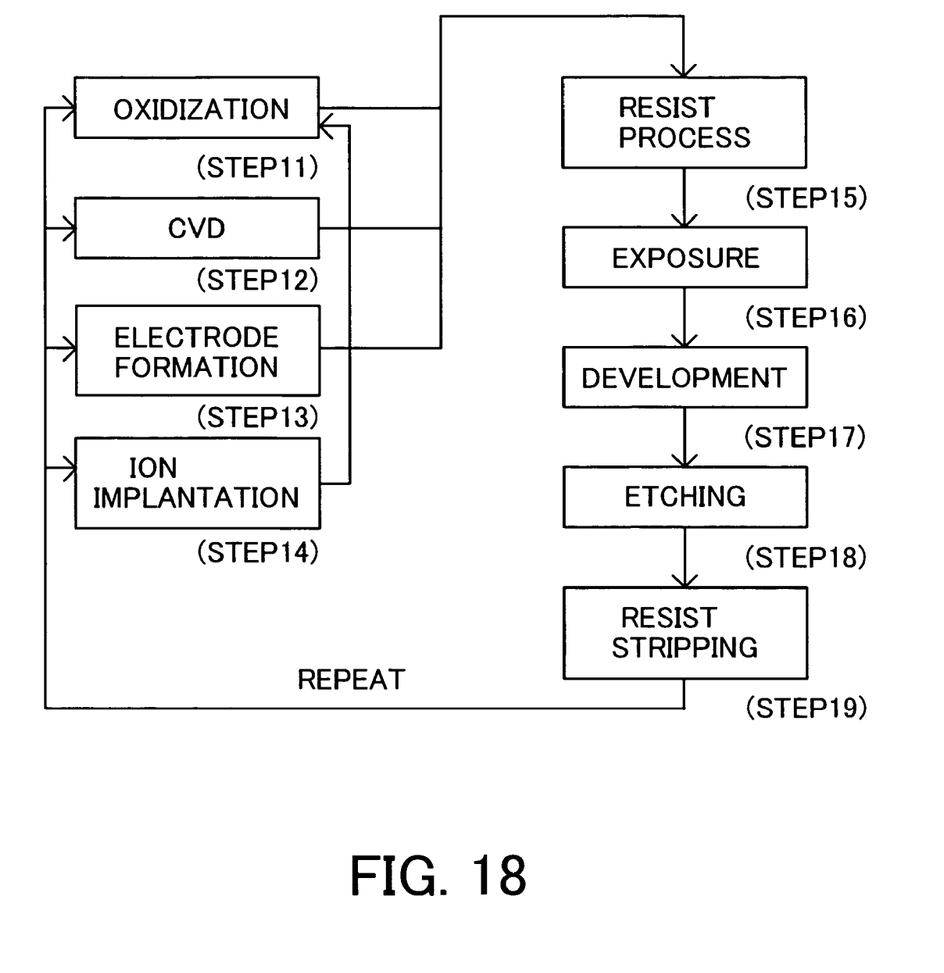
FIG. 18 is a detailed flowchart for Step 4 of wafer process shown in FIG. 17.

Referring now to FIGS. 17 and 18, a description will be given of an embodiment of a device fabrication method using the above exposure apparatus 1. FIG. 17 is a flowchart for explaining a fabrication of devices (i.e., semiconductor chips such as IC and LSI, LCDs, CCDs, etc.) A description will now be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 18 is a detailed flowchart of the wafer process in Step 4 in FIG. 17. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer.

Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The fabrication method of the instant embodiment makes the effective light source distribution uniform and manufactures high-quality devices with high throughput. In this manner, the device fabricating method that uses the exposure apparatus 1 and the device as a final product constitute one aspect according to the present invention.

Further, the present invention is not limited to these preferred embodiments, but various modifications and variations may be made without departing from the spirit and scope of the present invention. For example, in the instant embodiment, the unitary-type light integrator is located the element only in the one side of the substrate, but may be located the element in the both sides.

Thus, the present invention provides an illumination optical system and an exposure apparatus that can uniformly illuminate an illuminated surface even if an optical integrator is used.

This application claims foreign priority benefits based on Japanese Patent Application No. 2003-381928, filed on Nov. 12, 2003, which is hereby incorporated by reference herein in its entirety as if fully set forth herein.

What is claimed is:

1. An illumination optical system for Koehler-illuminating a target surface with light from a light source, said illumination optical system comprising:
   a light integrator for forming a secondary light source, said light integrator including plural lens elements integrated with a substrate;
   a condenser for condensing the light from the light integrator;
   a deflection member that deflects the light from the light source so that a principal ray of the light incident upon the light integrator can be unparallel to an optical axis of the condenser; and
   a shield arranged on a focal plane of the condenser, and configured to shield the light that has transmitted condenser and interfaces among the plural lens elements.

2. An exposure apparatus comprising:
   an illumination optical system for Koehler-illuminating a reticle with light from a light source; and
   a projection optical system for projecting a pattern of the reticle onto an object to be exposed,
   wherein the illumination optical system includes:
   a light integrator for forming a secondary light source, said light integrator including plural elements integrated with a substrate;
   a condenser for condensing the light from the light integrator;
   a deflection member that deflects the light from the light source so that a principal ray of the light incident upon the light integrator can be unparallel to an optical axis of the condenser; and
   a shield arranged on a focal plane of the condenser, and configured to shield the light that has transmitted the condenser and interfaces among the plural lens elements.

3. An exposure apparatus according to claim 2, wherein an optical axis of said projection optical system shifts from an optical axis of the illumination optical system from the light source to the condenser.

4. A device fabrication method comprising the steps of:
   exposing an object using an exposure apparatus; and
   developing the object exposed,
   wherein the exposure apparatus includes:
   an illumination optical system for Koehler-illuminating a reticle with light from a light source; and
   a projection optical system for projecting a pattern of the reticle onto an object to be exposed,
   wherein the illumination optical system includes:
   a light integrator for forming a secondary light source, said light integrator including plural lens elements integrated with onto a substrate;
   a condenser for condensing the light from the light integrator;
   a deflection member that deflects the light from the light source so that a principal ray of can be unparallel to an optical axis of the condenser; and
   a shield arranged on a focal plane of the condenser, and configured to shield the light that the condenser and interfaces among the plural lens elements.

* * * * *